US008669152B2

(12) United States Patent
Ryu et al.

(10) Patent No.: US 8,669,152 B2
(45) Date of Patent: Mar. 11, 2014

(54) METHODS OF MANUFACTURING SEMICONDUCTOR DEVICES

(75) Inventors: Ho-In Ryu, Suwon-si (KR); Jong-Un Kim, Seoul (KR); Hyeon-Kyu Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/240,301

(22) Filed: Sep. 22, 2011

(65) Prior Publication Data

US 2012/0164812 A1    Jun. 28, 2012

(30) Foreign Application Priority Data

Dec. 28, 2010    (KR) .................. 10-2010-0136812

(51) Int. Cl.
   *H01L 21/336*    (2006.01)
(52) U.S. Cl.
   USPC .......................................... 438/197; 257/368
(58) Field of Classification Search
   USPC ............................ 438/197; 257/368; 247/368
   See application file for complete search history.

(56) References Cited

U.S. PATENT DOCUMENTS

| 2002/0061616 | A1  | 5/2002 | Kim et al. |
| 2007/0039923 | A1* | 2/2007 | Kim ................................. 216/67 |
| 2009/0072289 | A1* | 3/2009 | Kim et al. ..................... 257/298 |
| 2010/0193901 | A1* | 8/2010 | Jang et al. ..................... 257/520 |

FOREIGN PATENT DOCUMENTS

| KR | 10-2002-0039839 A | 11/2000 |
| KR | 2010-0080689 A | 7/2010 |
| KR | 2010-0088395 A1 | 8/2010 |

* cited by examiner

*Primary Examiner* — Zandra Smith
*Assistant Examiner* — Jamie C Niesz
(74) *Attorney, Agent, or Firm* — Myers Bigel Sibley & Sajovec, P.A.

(57) ABSTRACT

In a method of manufacturing a semiconductor device, a mask is formed on a substrate. The substrate is divided into a first region and a second region. An upper portion of the substrate in the first region is partially removed using the mask as an etching mask to form a recess. A first gate structure is formed in the recess. A portion of the mask in the first region is removed. A blocking layer pattern is formed on the substrate in the first region over the first gate structure.

13 Claims, 11 Drawing Sheets

METHODS OF MANUFACTURING SEMICONDUCTOR DEVICES

CROSS-REFERENCE TO RELATED APPLICATION

This application claims priority under 35 USC §119 to Korean Patent Application No. 10-2010-0136812 filed on Dec. 28, 2010 in the Korean Intellectual Property Office (KIPO), the disclosure of which is herein incorporated by reference in its entirety.

BACKGROUND

1. Field

Example embodiments relate to methods of manufacturing semiconductor devices. More particularly, example embodiments relate to methods of manufacturing semiconductor devices including buried gate structures.

2. Description of the Related Art

As semiconductor devices have become more highly integrated, improved methods of forming fine patterns have been developed. However, reducing the size of certain features, such as transistor gate length, can have undesirable consequences. Accordingly, transistors having buried gate structures may be used in order to increase a channel length in a highly integrated device.

After forming the buried gate structure, subsequent processes, such as a cleaning process, an annealing process and/or an oxidation process for forming a gate structure in a peripheral circuit region may be further performed. During the subsequent processes, the buried gate structure may be adversely affected by oxide diffusion, etching damage, etc.

SUMMARY

Example embodiments provide methods of manufacturing a semiconductor device having excellent electrical characteristics.

According to example embodiments, there is provided a method of manufacturing a semiconductor device. In the method, a mask is formed on a substrate. The substrate is divided into a first region and a second region. An upper portion of the substrate in the first region is partially removed using the mask as an etching mask to form a recess. A first gate structure is formed in the recess. A portion of the mask in the first region is removed. A blocking layer pattern is formed over the first gate structure on the substrate in the first region.

In example embodiments, the mask may include silicon oxide.

In example embodiments, in removing the portion of the mask in the first region, a first photoresist pattern may be formed on a portion of the mask in the second region. A wet etching process may be performed on the mask.

In example embodiments, the blocking layer pattern may include silicon nitride.

In example embodiments, the blocking layer pattern may have a multi-stacked structure including a first blocking layer pattern and a second blocking layer pattern.

In example embodiments, the first blocking layer pattern may include silicon oxide and the second blocking layer pattern may include silicon nitride.

In example embodiments, in forming the blocking layer pattern, a blocking layer covering the first gate structure may be formed on the substrate in the first region and on a portion of the mask remaining in the second region. Portions of the blocking layer and the mask in the second region may be removed.

In example embodiments, in removing the portions of the blocking layer and the mask in the second region, the portion of the blocking layer in the second may be removed region by a planarizing process. The portion of the mask in the second region may be removed by a wet etching process.

In example embodiments, in removing the portions of the blocking layer and the mask in the second region, a second photoresist pattern may be formed on a portion of the blocking layer in the first region. The portions of the blocking layer and the mask in the second region may be removed by a dry etching process using the second photoresist pattern as an etching mask.

In example embodiments, a second gate structure may be further formed on the substrate in the second region after removing the portions of the blocking layer and the mask in the second region.

In example embodiments, in forming the first gate structure, a first gate insulation layer may be formed on an inner wall of the recess. A first gate electrode may be formed on the first gate insulation layer. The first gate electrode may partially fill the recess. A capping layer pattern may be formed on the first gate insulation layer and the first gate electrode. The capping layer pattern may fill a remaining portion of the recess.

In example embodiments, the capping layer pattern may include silicon nitride or silicon oxide.

According to example embodiments, there is provided a method of manufacturing a semiconductor device. In the method, a mask on is formed on a substrate including an impurity region. An upper portion of the substrate is partially removed using the mask as an etching mask to form a recess. A gate structure is formed in the recess. The mask is removed. A blocking layer pattern covering the gate structure is formed on the substrate. A plug is formed through the blocking layer pattern such that the plug is electrically connected to the impurity region. A capacitor electrically connected to the plug is formed on the blocking layer pattern.

In example embodiments, in forming the gate structure, a gate insulation layer is formed on an inner wall of the recess. A gate electrode is formed on the gate insulation layer. The gate electrode may partially fill the recess. A capping layer pattern is formed on the gate insulation layer and the gate electrode. The capping layer pattern may fill a remaining portion of the recess.

In example embodiments, the blocking layer pattern may further include a first blocking layer pattern including silicon oxide and a second blocking layer pattern including silicon nitride.

According to example embodiments, a mask may be removed after forming a buried gate structure, and a blocking layer pattern protecting the buried gate structure may be formed. By forming the blocking layer pattern, the buried gate structure may be more protected from being damaged during subsequent processes, such as a thermal oxidation process, an etching process, etc.

BRIEF DESCRIPTION OF THE DRAWINGS

Example embodiments will be more clearly understood from the following detailed description taken in conjunction with the accompanying drawings.

FIGS. 1 to 10 are cross-sectional views illustrating methods of manufacturing a semiconductor device in accordance with example embodiments;

FIGS. 11 to 14 are cross-sectional views illustrating methods of manufacturing a semiconductor device in accordance with other example embodiments;

FIGS. 15 to 16 are cross-sectional views illustrating methods of manufacturing a semiconductor device in accordance with still other example embodiments;

FIGS. 17 to 18 are cross-sectional views illustrating methods of manufacturing a semiconductor device in accordance with still other example embodiments; and FIGS. 19 to 22 are cross-sectional views illustrating methods of manufacturing a DRAM device in accordance with example embodiments.

DETAILED DESCRIPTION OF THE EMBODIMENTS

Figure 1:
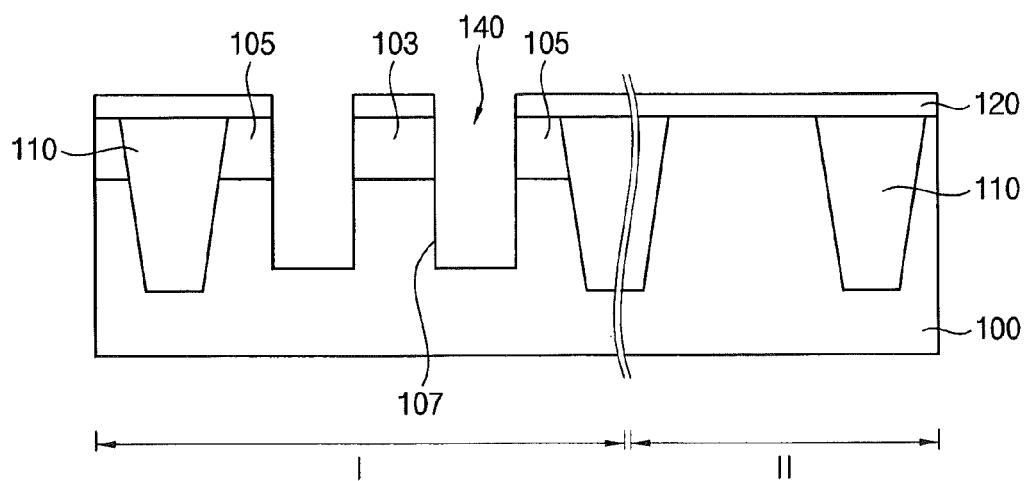
FIGS. 1 to 22 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, example embodiments will be explained in detail with reference to the accompanying drawings.

FIGS. 1 to 10 are cross-sectional views illustrating methods of manufacturing a semiconductor device in accordance with example embodiments.

Referring to FIG. 1, impurity regions 103,105 may be formed at upper portions of a substrate 100 in a first region I by, e.g., implanting impurities into the substrate 100. An isolation layer 110 may be formed on the substrate 100 to define an active region and an inactive region in the substrate 100.

The substrate 100 may include a semiconductor substrate, e.g., a silicon substrate, a germanium substrate, a silicon-germanium substrate, a silicon-on-insulator (SOI) substrate and/or a germanium-on-insulator (GOI) substrate. The substrate 100 may be divided into the first region I in which memory cells may be formed and a second region II in which peripheral circuits may be formed.

In example embodiments, the impurities may include n-type impurities such as arsenic or phosphorus, and the impurity regions may serve as source/drain regions of the memory cells.

The isolation layer 110 may be formed by a shallow trench isolation (STI) process. For example, after forming a first trench (not illustrated) at an upper portion of the substrate 100, an insulation layer filling the first trench may be formed on the substrate 100, and then an upper portion of the insulation layer may be planarized to form the isolation layer 110. The isolation layer 110 may be formed by a chemical vapor deposition (CVD) process, a high density plasma chemical vapor deposition (HDP-CVD) process, etc. In some example embodiments, prior to forming the isolation layer 110, a liner (not illustrated) may be further formed on an inner wall of the first trench using, e.g., a nitride.

An upper portion of the substrate 100 may be partially removed to form a second trench 140.

In example embodiments, a mask layer may be formed on the substrate 100. The mask layer may be patterned by, e.g., a photolithography process to form a mask 120. The upper portion of the substrate 100 may be etched using the mask 120 as an etching mask to form the second trench 140. The second trench 140 may be defined as a space by a recess 107 of the substrate 100 and sidewalls of the mask 120.

In example embodiments, the mask layer may be formed using silicon oxide.

By forming the second trench 140, the impurity regions may be divided into a first impurity region 103 and a second impurity region 105.

Figure 2:
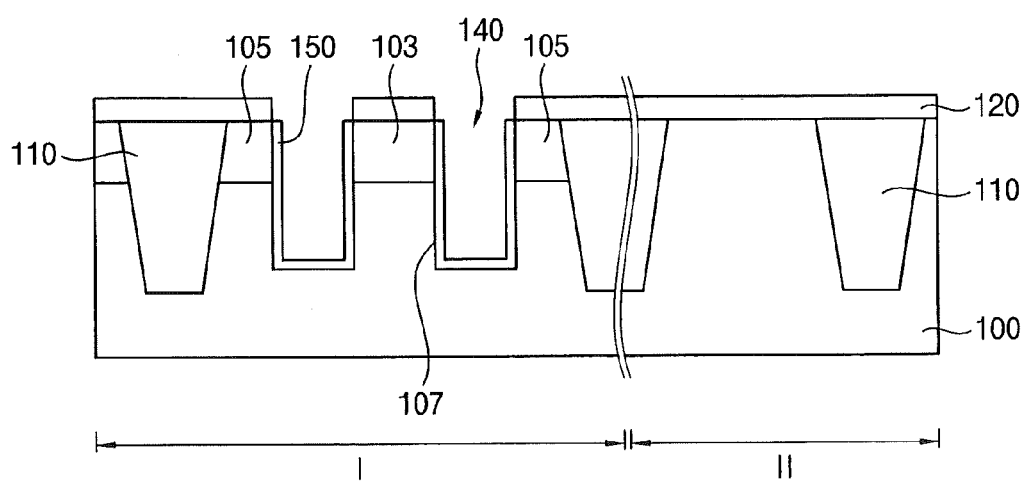

Referring to FIG. 2, a first gate insulation layer 150 may be formed on the recess 107 of the substrate 100.

In example embodiments, the first gate insulation layer 150 may be formed on the recess 107 of the substrate 100 by a thermal oxidation process and/or a radical oxidation process. In other example embodiments, the first gate insulation layer 150 may be formed by depositing a silicon oxide ($SiO_2$) or a metal oxide on the recess 107 of the substrate 100 and the mask 120 by, e.g., a CVD process, and then partially removing a portion of the silicon oxide and the metal oxide on the mask 120. The metal oxide may include hafnium oxide, tantalum oxide, zirconium oxide, etc.

Figure 3:
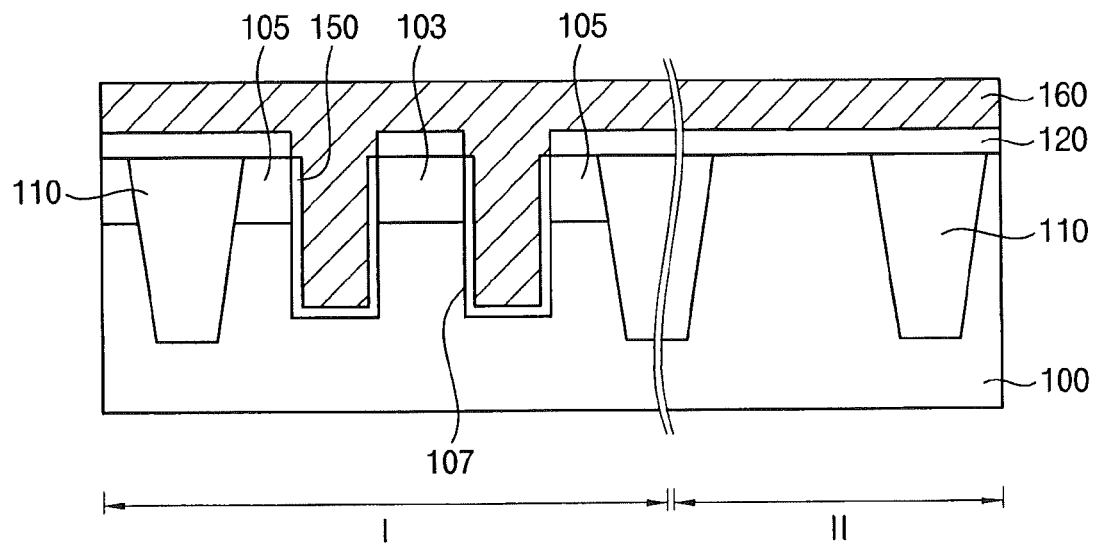

Referring to FIG. 3, a first gate electrode layer 160 may be formed in the second trench 140 on the first gate insulation layer 150, and/or the mask 120.

The first gate electrode layer 160 may be formed using a metal, e.g., tungsten (W), a metal nitride, e.g., tantalum nitride (TaN) and/or titanium nitride (TiN) and/or a metal silicide by an atomic layer deposition (ALD) process, and/or a physical vapor deposition (PVD) process, etc.

Figure 4:
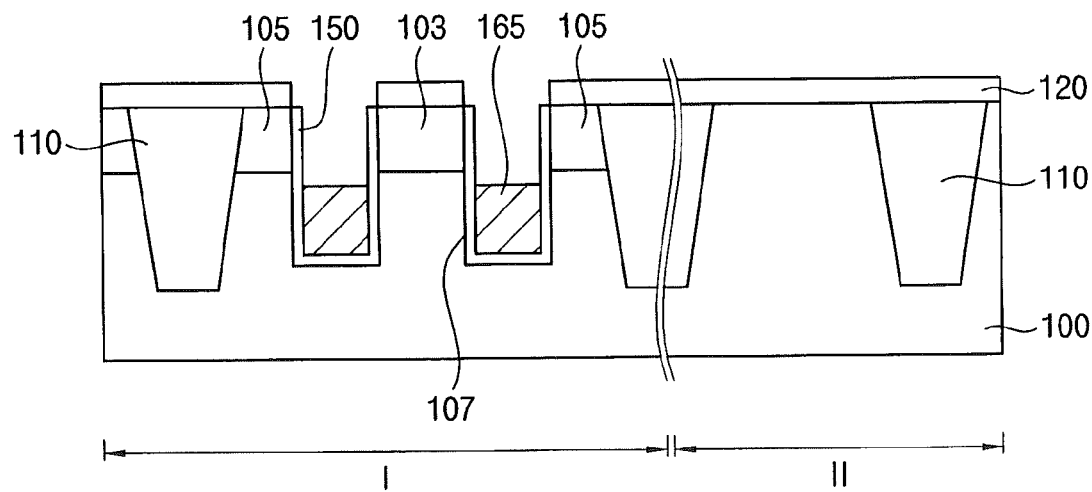

Referring to FIG. 4, an upper portion of the first gate electrode layer 160 may be removed to form a first gate electrode 165 that fills the second trench 140.

In example embodiments, the upper portion of the first gate electrode layer 160 may be planarized, for example by a chemical mechanical polishing (CMP) process, until a top surface of the mask 120 is exposed, and a portion of the first gate electrode layer 160 in an upper portion of the second trench 140 may be further removed by an anisotropic etching process to form the first gate electrode 165.

In example embodiments, the first gate electrode 165 may partially fill the recess 107 of the substrate 100.

Figure 5:
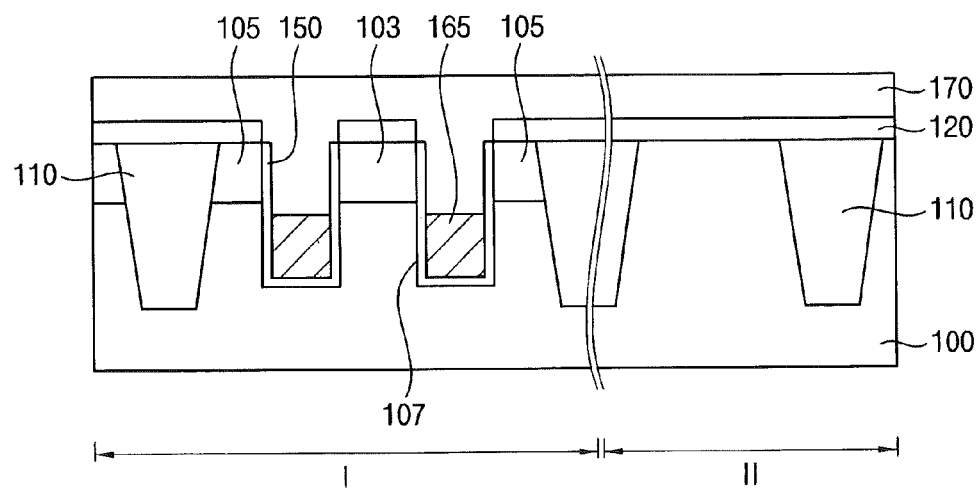

Referring to FIG. 5, a capping layer 170 may be formed on the first gate electrode 165, the first gate insulation layer 150 and the mask 120. The capping layer 170 may fill a remaining portion of the second trench 140. In example embodiments, the capping layer 170 may be formed using silicon oxide or silicon nitride.

Figure 6:
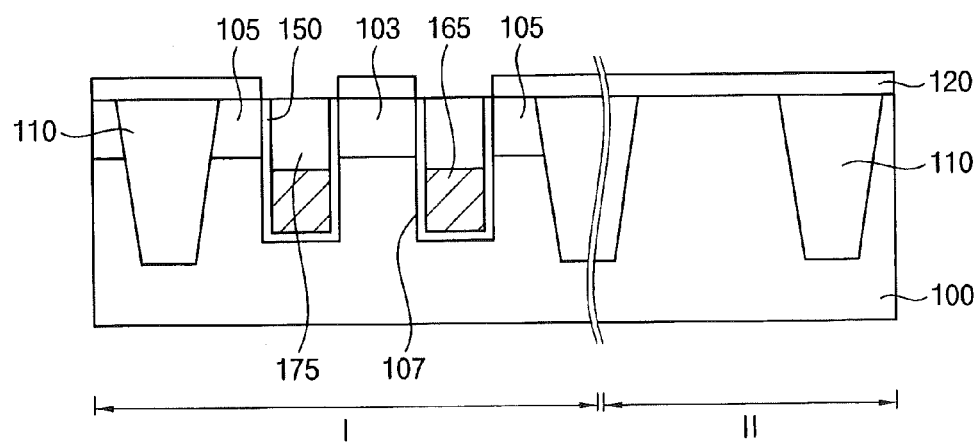

Referring to FIG. 6, an upper portion of the capping layer 170 may be removed, for example by a CMP process, until the top surface of the mask 120 is exposed, and a portion of the capping layer 170 formed on a sidewall of the mask 120 may be removed, for example by an etch-back process, thereby to form a capping layer pattern 175 on the first gate electrode 165. In example embodiments, the capping layer pattern 175 may fill a remaining portion of the recess 107 of the substrate 100.

The first gate insulation layer 150, the first gate electrode 165 and the capping layer pattern 175 may define a first gate structure. That is, a buried gate structure may be formed to fill the recess 107 of the substrate 100. Additionally, the first gate structure and the first and second impurity regions 103 and 105 may define a first transistor.

Figure 7:
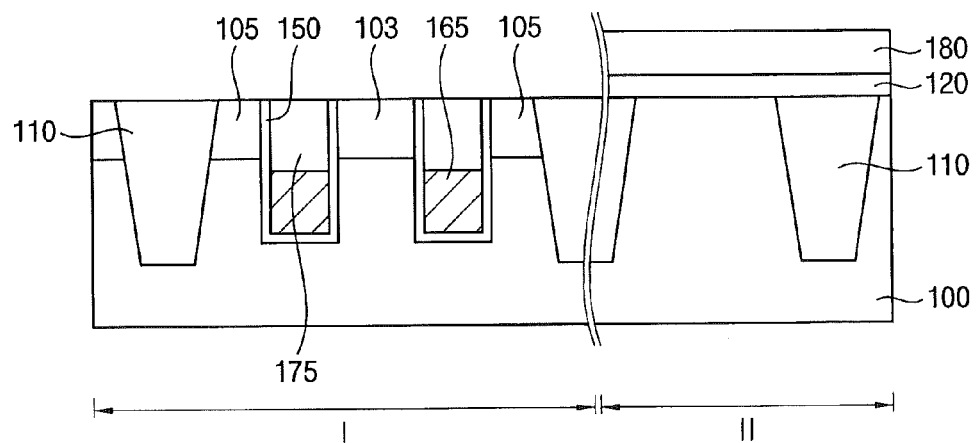

Referring to FIG. 7, a first photoresist pattern 180 may be formed on a portion of the mask 120 in the second region II, and a portion of the mask 120 in the first region I may be etched using the photoresist pattern as an etching mask. In example embodiments, the mask 120 may be partially removed, for example, by a wet etching process using fluoric acid (HF) or a buffer oxide etchant (BOE) solution as an etching solution.

The first photoresist pattern 180 may be removed by an ashing and/or a strip process.

Figure 8:
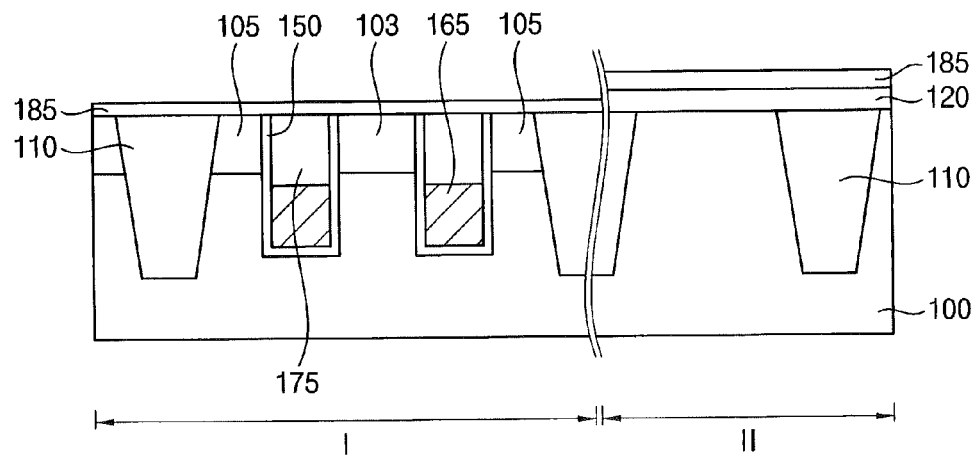

Referring to FIG. 8, a blocking layer 185 may be formed on the substrate 100, the isolation layer 110 and the mask 120 and may cover the first gate structure. In example embodiments, the blocking layer 185 may be formed using silicon nitride. By forming the blocking layer 185, the substrate 100 may be protected from an etching damage during a subsequent process for forming a bit line 220 (see FIG. 22). Further, the first region I of the substrate 100 may be protected by the blocking layer 185 from thermal or oxidizing processes that may be used in forming a second gate structure in the second region II. In particular, the blocking layer 185 may at least partially block oxide generated during such processes from diffusing to the first gate structure, which may limit oxidation of the first gate electrode 165.

Figure 9:
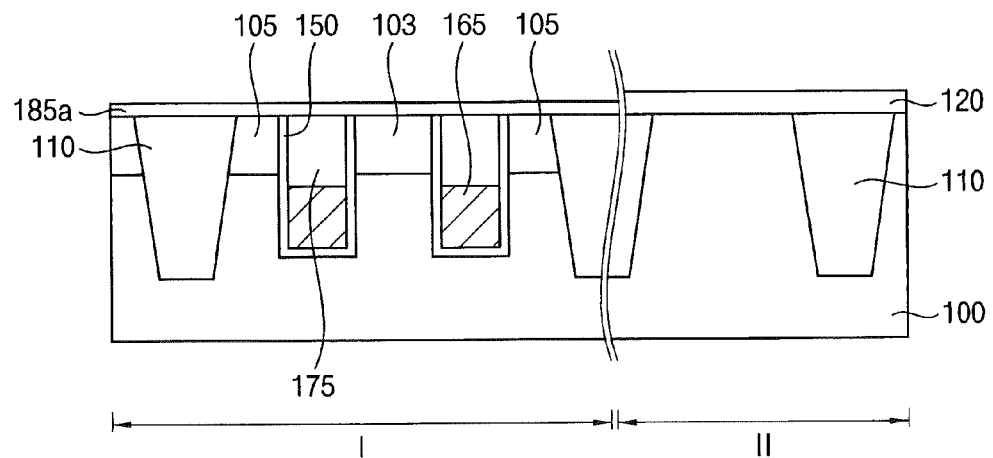

Referring to FIG. 9, a portion of the blocking layer 185 formed in the second region II may be removed by a CMP process to form a blocking layer pattern 185a in the first region I.

The portion of the blocking layer 185 in the second region II may be disposed on the mask 120, thereby to have a top surface higher than that of a portion of the blocking layer 185 in the first region I. Therefore, the portion of the blocking layer 185 in the second region II may be selectively removed by a CMP process. The mask 120 remaining in the second region II may serve as a polish stop layer for the CMP process.

Figure 10:
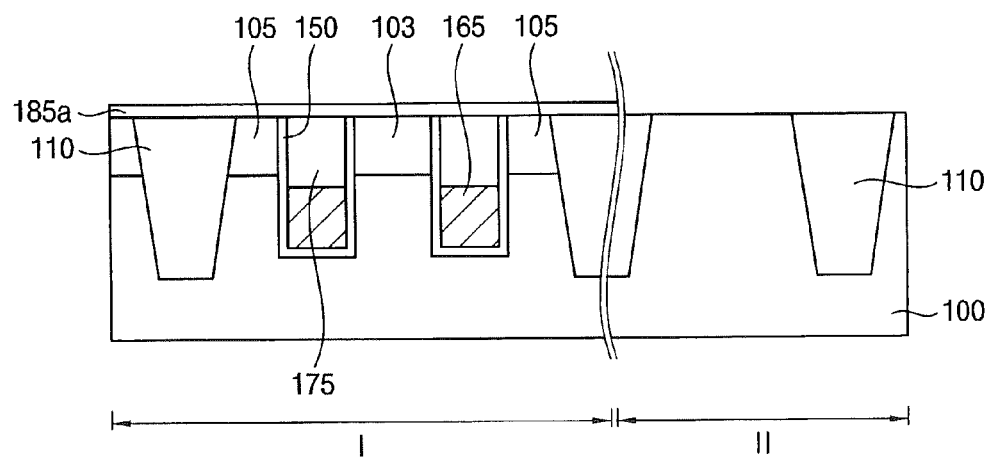

Referring to FIG. 10, the mask 120 remaining in the second region II may be removed.

In example embodiments, the mask 120 may be removed, for example, by a wet etching process using fluoric acid or a buffer oxide etchant (BOE) solution as an etching solution. The blocking layer pattern 185a including silicon nitride may have a very low etching rate with respect to the etching solution. Thus, the blocking layer pattern 185a may not be substantially removed by the etching solution.

By performing the above-illustrated processes, a semiconductor device including the buried gate structure protected by the blocking layer pattern 185a may be manufactured.

FIGS. 11 to 14 are cross-sectional views illustrating methods of manufacturing a semiconductor device in accordance with other example embodiments.

Figure 11:
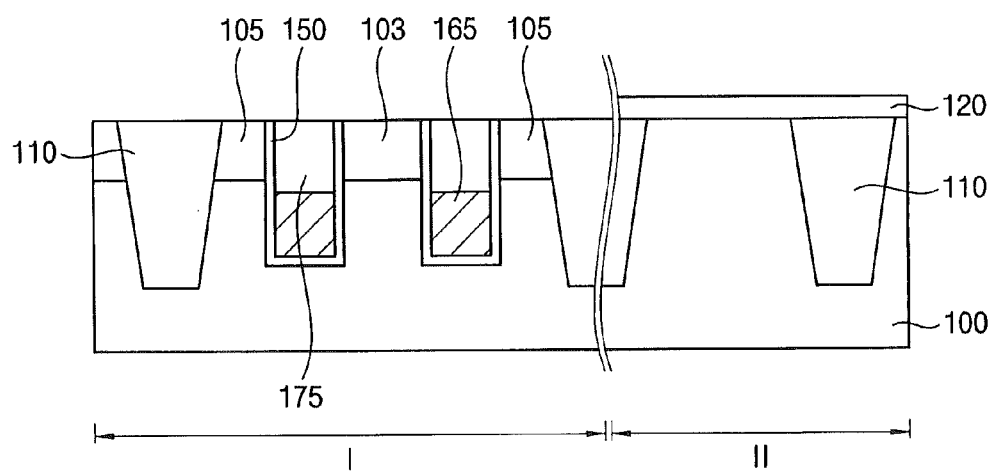

Referring to FIG. 11, processes substantially the same as or similar to those illustrated with reference to FIGS. 1 to 7 may be performed to form a first gate structure.

Figure 12:
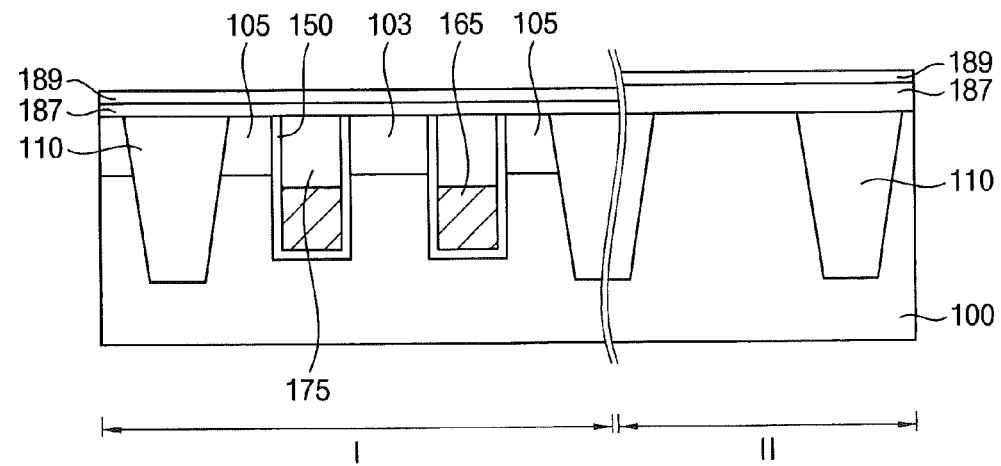

Referring to FIG. 12, a first blocking layer 187 may be sequentially formed on a substrate 100 and a mask 120 to cover the first gate structure and a second blocking layer 189.

In example embodiments, the first blocking layer 187 may be formed using silicon oxide and the second blocking layer

189 may be formed using silicon nitride. The mask 120 formed in a second region II may include silicon oxide, so that a portion of the first blocking layer 187 in the second region II may be merged to the mask 120. Thus, the portion of the first blocking layer 187 may have a thickness greater than that of a portion of the first blocking layer 187 in a first region I.

The first blocking layer 187 may reduce a stress applied to the substrate 100 and a first gate insulation layer 150 during the formation of the second blocking layer 189 including silicon nitride.

Figure 13:
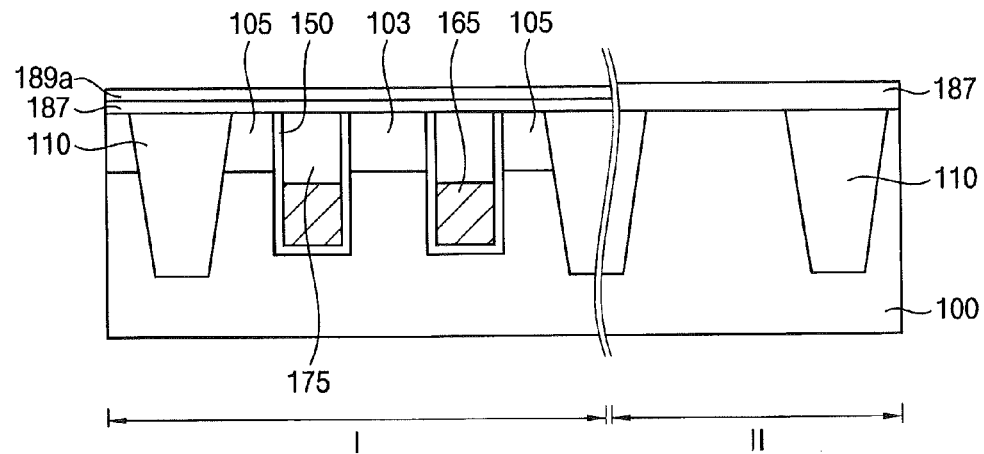

Referring to FIG. 13, a portion of the second blocking layer 189 in the second region II may be removed by a CMP process to form a second blocking layer pattern 189a in the first region I. As described above, the portion of the second blocking layer 189 in the second region II may be formed on the portion of the first blocking layer 187 in the second region II which may have a thickness greater than that of the portion of the first blocking layer 187 in the first region I. Accordingly, the portion of the second blocking layer 189 in the second region II may be selectively removed by the CMP process. The portion of the first blocking layer 187 in the second region II may serve as a polish stop layer, however, it may be partially removed during the CMP process.

Figure 14:
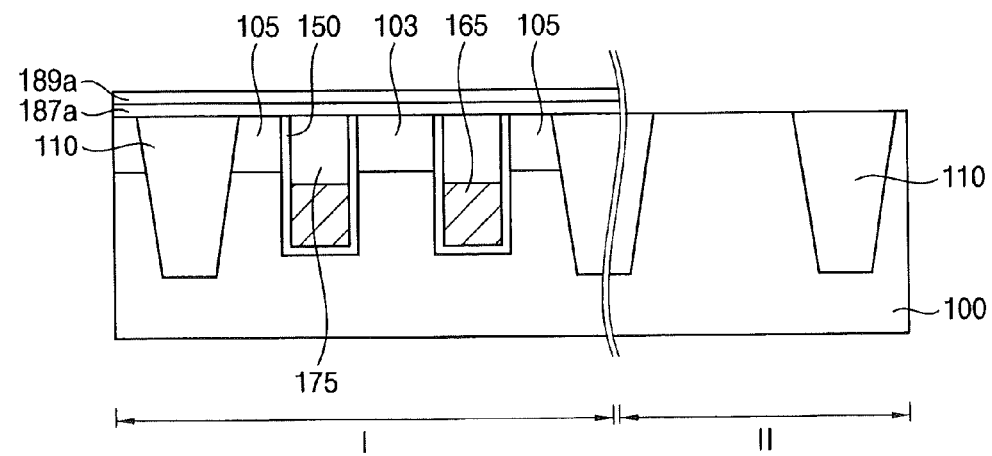

Referring to FIG. 14, the portion of the first blocking layer 187 in the second region II may be removed to form first and second blocking layer patterns 187a and 189a in the first region I. In example embodiments, the portion of the first blocking layer 187 in the second region II may be removed, for example, by a wet etching process using fluoric acid or a BOE solution as an etching solution. The portion of the first blocking layer 187 in the first region I may be protected by the second blocking layer pattern 189a including silicon nitride, and thereby may not substantially be removed.

By performing the above-illustrated processes, a semiconductor device including a buried gate structure protected by the first and second blocking layer patterns 187a and 189a may be manufactured.

Figure 15:
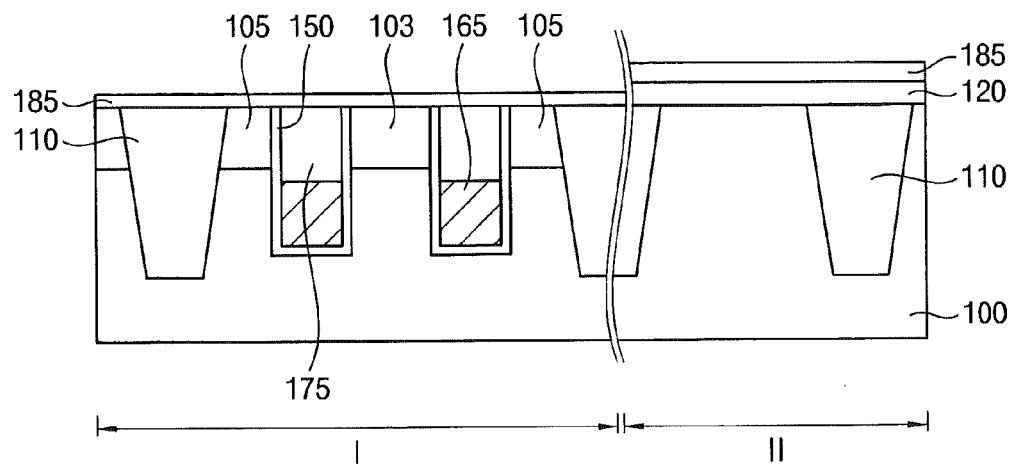
Figure 16:
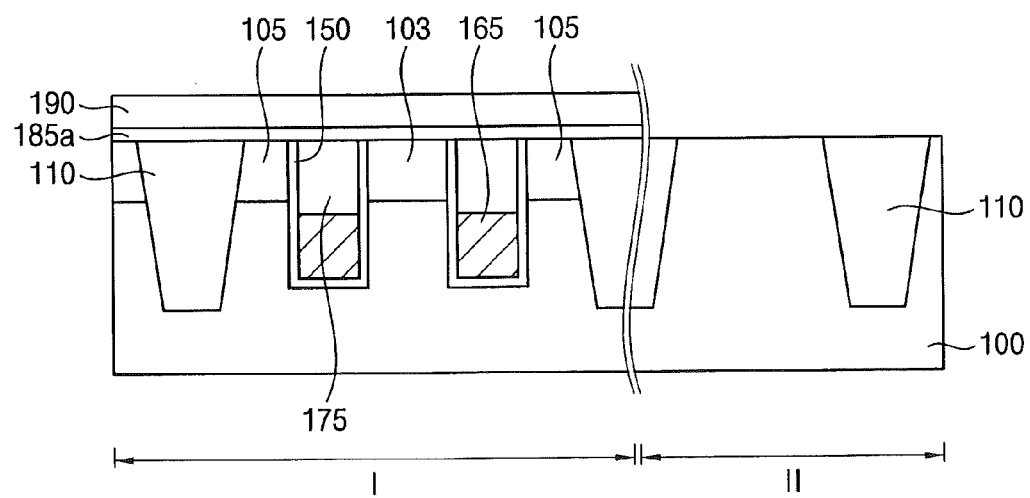

FIGS. 15 to 16 are cross-sectional views illustrating methods of manufacturing a semiconductor device in accordance with still other example embodiments.

Referring to FIG. 15, processes substantially the same as or similar to those illustrated with reference to FIGS. 1 to 8 may be performed to form a blocking layer 185 covering a first gate structure on a substrate 100 and a mask 120.

Referring to FIG. 16, a second photoresist pattern 190 covering a portion of the blocking layer 185 in a first region I may be formed, and then a portion of the blocking layer 185 in a second region II and the mask 120 may be etched using the second photoresist pattern II as an etching mask. In example embodiments, the etching process may be a dry etching process using, e.g., $CH_3F$, $CHF_3$, $CF_4$, $C_2F_6$, $NF_3$, $O_2$, Ar, etc., as an etching gas.

The second photoresist pattern 190 may be removed by an ashing process and/or a strip process.

Accordingly, a blocking layer pattern 185a may be formed in the first region I.

Figure 17:
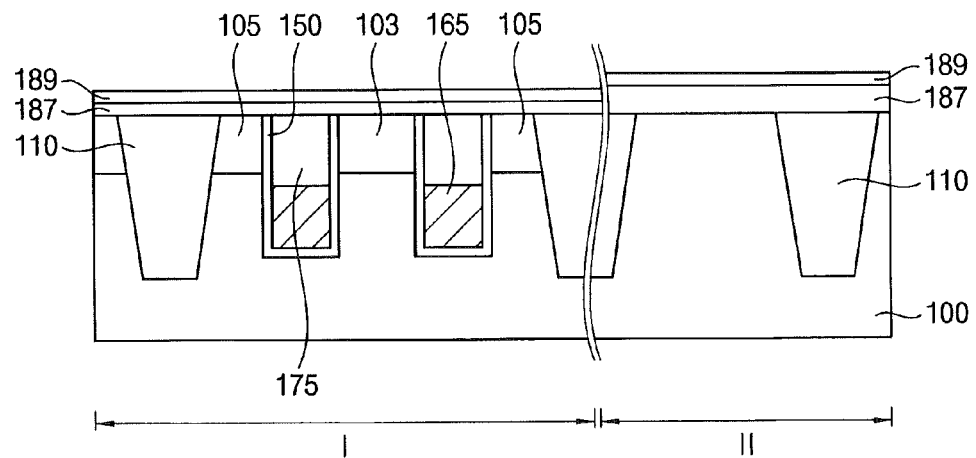
Figure 18:
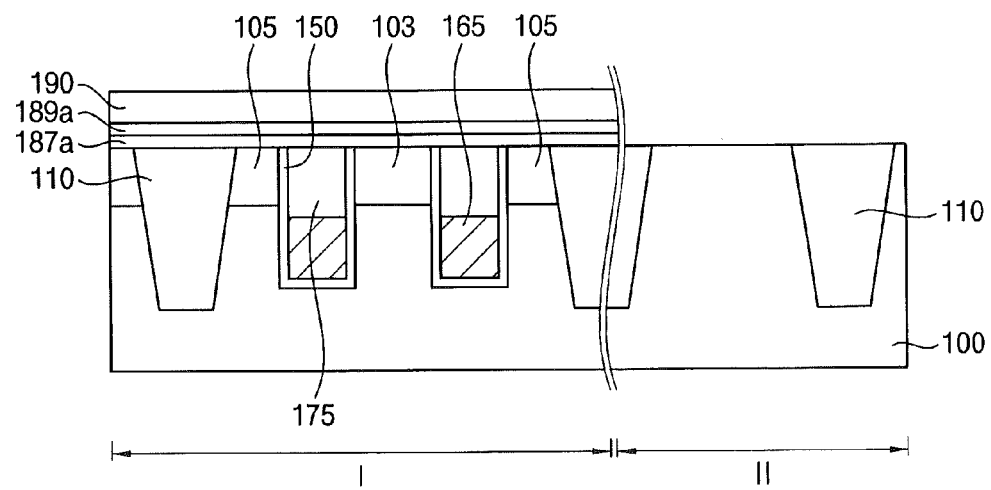

FIGS. 17 to 18 are cross-sectional views illustrating methods of manufacturing a semiconductor device in accordance with still other example embodiments.

Referring to FIG. 17, processes substantially the same as or similar to those illustrated with reference to FIGS. 11 and 12 may be performed to form a first blocking layer 187 covering a first gate structure and a second blocking layer 189 sequentially on a substrate 100 and a isolation layer 110.

Referring to FIG. 18, a second photoresist pattern 190 may be formed on a portion of the second blocking layer 189 in a first region I. Portions of the first and second blocking layers 187 and 189 in a second region II may be etched using the second photoresist pattern 190 as an etching mask to form first and second blocking layer patterns 187a and 189a in the first region I. In example embodiments, the etching process may be a dry etching process using, e.g., $CH_3F$, $CHF_3$, $CF_4$, $C_2F_6$, $NF_3$, $O_2$, Ar, etc., as an etching gas.

The second photoresist pattern 190 may be removed by an ashing process and/or a strip process.

FIGS. 19 to 22 are cross-sectional views illustrating methods of manufacturing a dynamic random access memory (DRAM) device in accordance with example embodiments.

Figure 19:
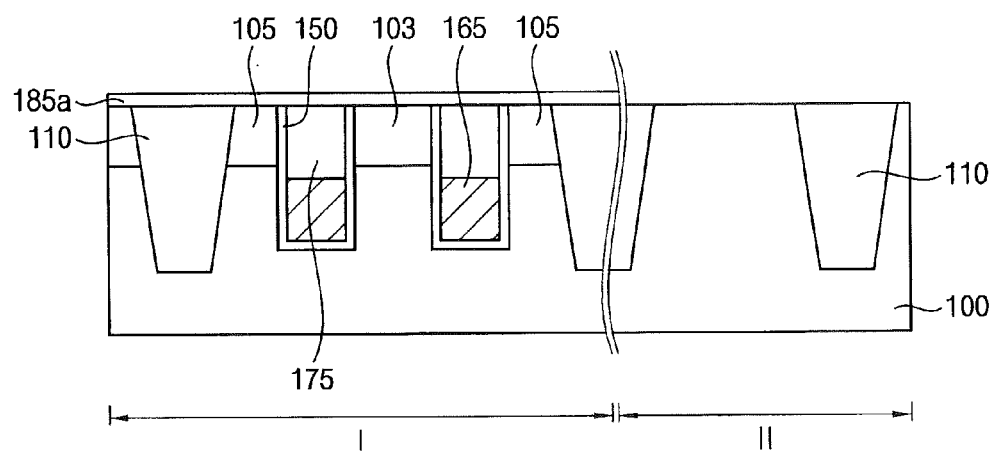

Referring to FIG. 19, processes substantially the same as or similar to those illustrated with reference to FIGS. 1 to 10 may be performed to form a buried gate structure protected by a blocking layer pattern 185a in a first region I of a substrate 100.

Figure 20:
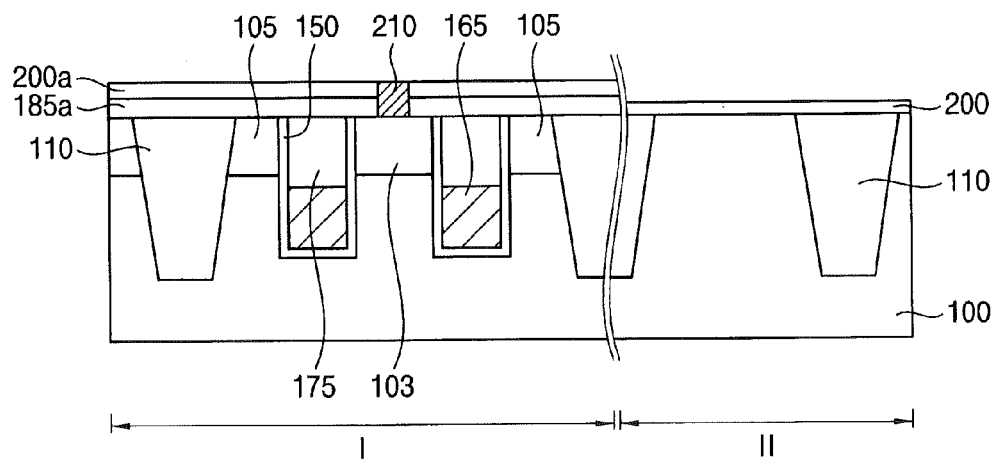

Referring to FIG. 20, an insulation layer may be formed on the blocking layer pattern 185a and on the substrate 100 in a second region II.

In example embodiments, the insulation layer may be formed using silicon oxide by a CVD process. Hereinafter, a portion of the insulation layer formed on the substrate 100 in the second region II may be referred to as a second gate insulation layer 200, and a portion of the insulation layer formed on the blocking layer pattern 185a in the first region I may be referred to as a first insulating interlayer 200a.

In example embodiments, prior to forming the insulation layer, a cleaning process may be further performed in order to remove etching residues remaining on the substrate 100 in the second region II. During the cleaning process, the buried gate structure in the first region I may be protected by the blocking layer pattern 185a.

A first hole (not illustrated) exposing a first impurity region 103 may be formed through the first insulating interlayer 200a and the blocking layer pattern 185a. A first conductive layer may be formed in the first hole on the first insulating interlayer 200a and the first impurity region 103. An upper portion of the first conductive layer may be planarized to form a first plug 210 that is electrically connected to the first impurity region 103. In example embodiments, the first conductive layer may be formed using a metal, a metal nitride, a metal silicide and/or doped polysilicon.

Figure 21:
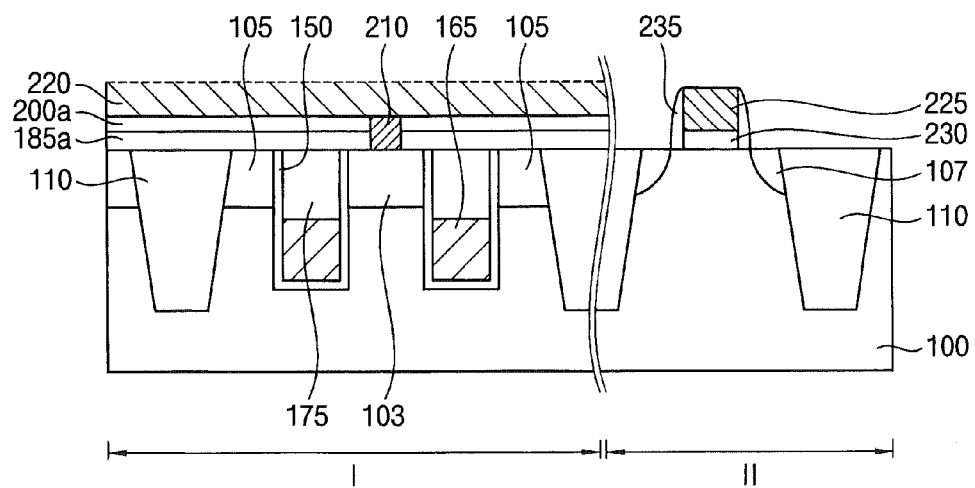

Referring to FIG. 21, a second conductive layer may be formed on the first insulating interlayer 200a, the first plug 210 and the second gate insulation layer 200. The second conductive layer may be patterned to form a bit line 220 electrically connected to the first plug 210 on the first insulating interlayer 200a in the first region I and a second gate electrode 225 on the second gate insulation layer 200 in the second region II.

In example embodiments, the second conductive layer may be patterned by a plasma etching process. During the plasma etching process, the blocking layer pattern 185a in the first region I may protect a top surface of the substrate 100. Accordingly, the substrate 100 in the first region I in which the memory cells are formed may be protected from the plasma etching damage.

The second gate insulation layer 200 formed in the second region II may be patterned using the second gate electrode 225 as an etching mask to form a second gate insulation layer pattern 230. The second gate electrode 225 and the second gate insulation layer pattern 230 may define a second gate structure.

A spacer 235 may be formed on a sidewall of the second gate structure, and a third impurity region 107 may be formed at an upper portion of the substrate 100 adjacent to the second gate structure by an ion-implantation process using the second gate structure and the spacer 235 as an ion-implantation mask.

In example embodiments, a silicon nitride layer covering the second gate structure may be formed on the substrate 100 in the second region II. The silicon nitride layer may be patterned by, e.g., an anisotropic etching process to form the spacer 235.

The second gate structure and the third impurity region 107 may define a second transistor.

Figure 22:
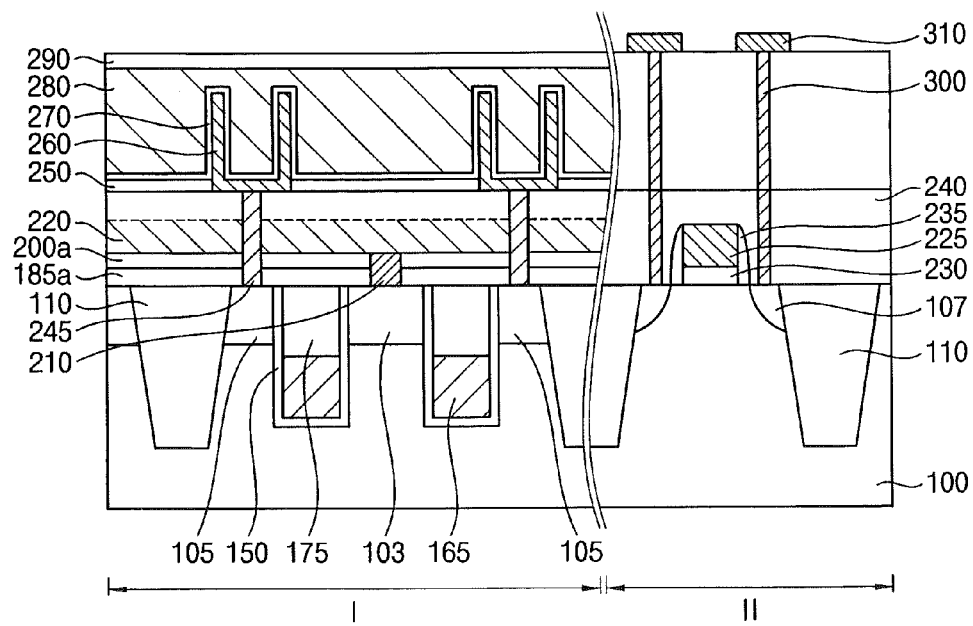

Referring to FIG. 22, a second insulating interlayer 240 covering the bit line 220, the second gate structure and the spacer 235 may be formed on the first insulating interlayer 200a, the first plug 210 and the substrate 100.

Second openings (not illustrated) may be formed through the second insulating interlayer 240, the first insulating interlayer 200a and the blocking layer pattern 185a to expose the second impurity regions 105. A third conductive layer may be formed on the second impurity regions 105 and the second insulating interlayer 240 to sufficiently fill the second openings. The third conductive layer may be formed using, e.g., doped polysilicon, a metal, a metal nitride, and/or a metal silicide. An upper portion of the third conductive layer may be planarized until a top surface of the second insulating interlayer 240 is exposed to form second plugs 245 that are electrically connected to the second impurity regions 105 in the second openings.

An etch stop layer 250 and a mold layer (not illustrated) may be sequentially formed on the second plugs 245 and the second insulating interlayer 240. The mold layer and the etch stop layer 250 may be partially removed to form third openings exposing top surfaces of the second plugs 245.

A lower electrode layer may be formed on bottoms and sidewalls of the third openings and on the mold layer. The lower electrode layer may be formed using a metal, a metal nitride or doped polysilicon. For example, the lower electrode layer may be formed using titanium, titanium nitride, tantalum, tantalum nitride, aluminum, aluminum nitride, titanium-aluminum nitride, tungsten nitride, ruthenium, etc.

The sacrificial layer (not illustrated) may be formed on the lower electrode layer. Upper portions of the sacrificial layer and the lower electrode layer may be planarized until a top surface of the mold layer is exposed, and then remaining portions of the sacrificial layer and the mold layer may be removed to form a lower electrode 260 electrically connected to the second plug 245.

A dielectric layer 270 may be formed on the lower electrode 260 and the etch stop layer 250. The dielectric layer 270 may be formed using a material having a higher dielectric constant than that of silicon nitride or silicon oxide, e.g., hafnium oxide, titanium oxide, tantalum oxide, zirconium oxide, aluminum oxide, etc.

An upper electrode 280 may be formed on the dielectric layer 270. The upper electrode 280 may be formed using a metal and/or a metal nitride, e.g., titanium nitride, tantalum nitride, tungsten nitride, ruthenium, etc.

The lower electrode 260, the dielectric layer 270 and the upper electrode 280 may define a capacitor.

A third insulating interlayer 290 covering the capacitor may be formed on the second insulating interlayer 240. Fourth openings (not illustrated) may be formed through the third and second insulating interlayers 290 and 240 in the second region II to expose the third impurity region 107. A fourth conductive layer may be formed on the third impurity region 107 and the third insulating interlayer 290 to fill the fourth openings. An upper portion of the fourth conductive layer may be planarized until a top surface of the third insulating interlayer 290 is exposed to form third plugs 300 that are electrically connected to the third impurity region 107.

A wiring 310 electrically connected to the third plug 300 may be formed on the third insulating interlayer 290, and a protection layer (not illustrated) protecting the wiring 310 may be further formed, thereby to obtain the semiconductor device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising sequentially:
   forming a mask on a first region and a second region of a substrate;
   etching the substrate in the first region using the mask as an etching mask to form a recess in the substrate;
   forming a first gate structure in the recess;
   removing the mask from the first region completely and not from the second region;
   forming a blocking layer pattern on the substrate in the first region; and
   removing the mask from the second region.

2. The method of claim 1, wherein the mask comprises silicon oxide.

3. The method of claim 1, wherein removing the mask from the first region comprises:
   forming a photoresist pattern on a portion of the mask in the second region; and
   performing a wet etching process on the mask to expose the substrate in the first region.

4. The method of claim 1, wherein forming the blocking layer pattern comprises:
   forming a blocking layer on the first gate structure on the substrate in the first region and on a portion of the mask in the second region; and
   removing portions of the blocking layer and the mask in the second region.

5. The method of claim 4, wherein removing the portions of the blocking layer and the mask in the second region comprises:
   removing the portion of the blocking layer in the second region by a planarizing process; and
   removing the portion of the mask in the second region by a wet etching process.

6. The method of claim 4, wherein removing the portions of the blocking layer and the mask in the second region comprises:
   forming a second photoresist pattern on a portion of the blocking layer in the first region; and removing the portions of the blocking layer and the mask in the second region by a dry etching process using the second photoresist pattern as an etching mask.

7. The method of claim 4, further comprising forming a second gate structure on the substrate in the second region after removing the portions of the blocking layer and the mask in the second region.

8. The method of claim 1, wherein forming the first gate structure comprises:
 forming a first gate insulation layer on an inner wall of the recess;
 forming a first gate electrode in the recess on the first gate insulation layer; and
 forming a capping layer pattern in the recess on the first gate insulation layer and the first gate electrode.

9. The method of claim 8, wherein the capping layer pattern comprises silicon nitride or silicon oxide.

10. A method of manufacturing a semiconductor device, the method comprising sequentially:
 forming a mask on a first region and a second region of a substrate including an impurity region;
 etching an upper portion of the first region of the substrate using the mask as an etching mask to form a recess in the substrate;
 forming a gate structure in the recess;
 removing the mask from the first region completely and not from the second region;
 forming a blocking layer pattern on the gate structure and on the substrate in the first region;
 removing the mask from the second region;
 forming a plug that extends through the blocking layer pattern and that is electrically connected to the impurity region; and forming a capacitor that is electrically connected to the plug on the blocking layer pattern.

11. The method of claim 10, wherein forming the gate structure comprises:
 forming a gate insulation layer on an inner wall of the recess;
 forming a gate electrode in the recess on the gate insulation layer; and
 forming a capping layer pattern in the recess on the gate insulation layer and the gate electrode.

12. A method of manufacturing a semiconductor device, the method comprising sequentially:
 forming a mask on a first region and a second region of a substrate;
 forming a recess in the first region of the substrate;
 forming a gate structure in the recess;
 forming a capping layer in the recess on the gate structure;
 removing the mask from the first region completely and not from the second region;
 forming a blocking layer pattern on the gate structure and on the first region of the substrate, the blocking layer pattern comprising a material that is resistant to plasma etching;
 removing the mask from the second region;
 forming a conductive layer on the blocking layer pattern; and
 plasma etching the conductive layer to form a bit line on the blocking layer pattern.

13. The method of claim 12, wherein the gate structure comprises a first gate structure in a first region of the substrate, the method further comprising:
 forming a second gate structure in a second region of the substrate after forming the blocking layer pattern.

\* \* \* \* \*